US 11,724,484 B2

(12) United States Patent
Lee et al.

(10) Patent No.: US 11,724,484 B2
(45) Date of Patent: Aug. 15, 2023

(54) METHOD AND SYSTEM FOR MANUFACTURING DISPLAY UNIT

(71) Applicant: SHANJIN OPTOELECTRONICS (SUZHOU) CO., LTD., Zhangjiagang (CN)

(72) Inventors: Beom Seok Lee, Daejeon (KR); Hang Suk Choi, Daejeon (KR); Eung Jin Jang, Daejeon (KR)

(73) Assignee: SHANJIN OPTOELECTRONICS (SUZHOU) CO., LTD., Jiangsu (CN)

( * ) Notice: Subject to any disclaimer, the term of this patent is extended or adjusted under 35 U.S.C. 154(b) by 373 days.

(21) Appl. No.: 16/754,084

(22) PCT Filed: Dec. 20, 2018

(86) PCT No.: PCT/KR2018/016335
§ 371 (c)(1),
(2) Date: Apr. 6, 2020

(87) PCT Pub. No.: WO2019/125009
PCT Pub. Date: Jun. 27, 2019

(65) Prior Publication Data
US 2020/0331251 A1    Oct. 22, 2020

(30) Foreign Application Priority Data

Dec. 21, 2017   (KR) .......................... 10-2017-0177280

(51) Int. Cl.
*B32B 37/22* (2006.01)
*B32B 7/12* (2006.01)
(Continued)

(52) U.S. Cl.
CPC ................ *B32B 37/22* (2013.01); *B32B 7/12* (2013.01); *B32B 38/0004* (2013.01);
(Continued)

(58) Field of Classification Search
CPC ....... B29C 2793/0054; B29C 2793/007; Y10T 156/1064; Y10T 156/1074;
(Continued)

(56) References Cited

U.S. PATENT DOCUMENTS 8,894,793 B2    11/2014  Hirata et al.
9,682,543 B2 *   6/2017  Kim ........................ B32B 38/18
(Continued)

FOREIGN PATENT DOCUMENTS

CN    101639548 A    2/2010
CN    102929029 A    2/2013
(Continued)

OTHER PUBLICATIONS

WayBackMachine for earliest publication date of "Liquid-crystal display—from Wikipedia" as Jun. 22, 2004, 1 page. (Year: 2004).*
(Continued)

*Primary Examiner* — Linda L Gray
(74) *Attorney, Agent, or Firm* — Schmeiser, Olsen & Watts, LLP (57) ABSTRACT

A method for manufacturing a display unit according to an exemplary embodiment of one aspect of the present invention includes: unwinding a first film from a first film roll, and carrying the first film; attaching a second film onto the carried first film and forming an elongated film laminated body; forming a cutting line in the film laminated body in a width direction at intervals along a longitudinal direction and forming a film sheet piece; and laminating the film sheet piece on a first surface of a panel.

4 Claims, 6 Drawing Sheets

(51) Int. Cl.
*B32B 38/00* (2006.01)
*G02F 1/13* (2006.01)
*G02F 1/1335* (2006.01)
*H10K 50/86* (2023.01)
*H10K 71/00* (2023.01)

(52) U.S. Cl.
CPC ...... *G02F 1/1303* (2013.01); *G02F 1/133528* (2013.01); *H10K 50/86* (2023.02); *H10K 71/00* (2023.02); *B32B 2307/42* (2013.01); *B32B 2457/206* (2013.01)

(58) Field of Classification Search
CPC ......... Y10T 156/1085; Y10T 156/1084; Y10T 156/1082; Y10T 156/1075; B32B 37/22; B32B 7/12; B32B 2307/42; B32B 38/0004; B32B 2457/206; G02F 1/1303; G02F 1/13328; H01L 51/5281; H01L 51/56
See application file for complete search history.

(56) References Cited

U.S. PATENT DOCUMENTS

| | | | |
|---|---|---|---|
| 9,897,839 B2* | 2/2018 | Hada | G02F 1/1303 |
| 2005/0016670 A1* | 1/2005 | Kanbara | G02F 1/133528 156/289 |
| 2010/0024972 A1* | 2/2010 | Kumagai | B29D 11/0073 156/265 |
| 2010/0073770 A1* | 3/2010 | Kumagai | G02B 5/30 359/488.01 |
| 2012/0003400 A1 | 1/2012 | Nishimura et al. | |
| 2017/0168348 A1 | 6/2017 | Lee et al. | |

FOREIGN PATENT DOCUMENTS

| | | |
|---|---|---|
| CN | 103226256 A | 7/2013 |
| CN | 103975271 A | 8/2014 |
| CN | 104169756 A | 11/2014 |
| JP | 2011237757 A | 11/2011 |
| JP | 2012048045 A | 3/2012 |
| JP | 2013037221 A | 2/2013 |
| JP | 2013156469 A | 8/2013 |
| JP | 2013218317 A | 10/2013 |
| JP | 2013218319 A | 10/2013 |
| JP | 2015014657 A | 1/2015 |
| JP | 2017534073 A | 11/2017 |
| KR | 10-2011-0113747 A | 10/2011 |
| KR | 10-2013-0018490 A | 2/2013 |
| KR | 10-2013-0088732 A | 8/2013 |
| KR | 10-2016-0129760 A | 11/2016 |
| KR | 10-1696554 B1 | 1/2017 |
| TW | 201314313 A | 4/2013 |
| TW | 201343399 A | 11/2013 |
| WO | 2010092926 A1 | 8/2012 |

OTHER PUBLICATIONS

"Liquid-crystal display—from Wikipedia", Jun. 22, 2004, 39 pages. (Year: 2004).*

* cited by examiner

METHOD AND SYSTEM FOR MANUFACTURING DISPLAY UNIT

The present application is a National Phase entry of International Application No. PCT/KR2018/016335 filed Dec. 20, 2018, and claims priority to and the benefit of Korean application no. KR 10-2017-0177280 filed Dec. 21, 2017, the entire contents of which are incorporated herein by reference,

FIELD

The present invention relates to a system for manufacturing a display unit, which manufactures a display unit by attaching a film to a panel.

BACKGROUND

A display unit may be manufactured by attaching a functional optical film, such as a polarization film and/or a phase difference film, a brightness improving film, and a diffusion film, onto a surface of a panel.

In the meantime, it is necessary to attach a polarization film and a functional optical film to one surface of the panel in a laminated form in order to efficiently use light.

In the related art, a scheme is mainly used of pre-manufacturing a film laminated body roll having a form in which a polarization film and a functional film are laminated, storing the pre-manufactured film laminated body roll in the form of the film laminated body roll, providing the film laminated body roll by inserting the film laminated body roll into a manufacturing line, cutting the film laminated body roll, and attaching the cut film laminated body roll to one surface of a panel. However, according to this scheme, there is a problem in that quality of the film laminated body is degraded, such as the case where a curl is formed according to the storage of the film laminated body in roll form, or the case where deformation is caused due to pressing by both the polarization film and the functional film by a width boundary line between the polarization film and the functional film.

In order to solve this problem, a scheme of first providing and attaching any one of a polarization film and a functional film to one surface of a panel, peeling a surface protecting film, and then attaching the other film may be considered. However, the scheme of separately supplying the polarization film and the functional film and sequentially attaching the polarization film and the functional film has a problem in that space efficiency is degraded because a plurality of film carrying lines need to be provided. Further, in order to attach the film in the subsequent process, a process of peeling the surface protecting film from the film attached with a sheet piece is required, and the process requires more time than a processing time of the case where the attachment of the film is carried in a continuous film carrying line and degrades efficiency of the process, and there may be a high probability that foreign substances may flow into a space between the film and the other film.

The background art are technical information, which the inventors may have for deriving the exemplary embodiments of the present invention or acquired during the derivation process, and it cannot be said that the background art is a publicly known technology published to the general public before the exemplary embodiments of the present invention are filed.

SUMMARY

Exemplary embodiments of the present invention provide a method and a system for manufacturing a display unit, in which a film laminated body is supplied while maintaining high quality, and is attached to a panel.

A method for manufacturing a display unit according to an exemplary embodiment of one aspect of the present invention includes: unwinding a first film from a first film roll, and carrying the first film; attaching a second film onto the carried first film, and forming an elongated film laminated body; forming a cutting line in the film laminated body in a width direction at intervals along a longitudinal direction, forming a film sheet piece; and laminating the film sheet piece onto a first surface of a panel.

In the present exemplary embodiment, any one of the first film and the second film may be a polarizing film including a polarizing plate, and the other may be an optical film including at least one of a brightness improving film, a light collecting sheet, a diffusion film, and a phase difference film.

In the present exemplary embodiment, any one of the first film and the second film may be a polarizing film including a polarizing plate having an absorption axis, and the other may be an optical film including a brightness improving film having a transmission axis, and the forming of the film laminated body may include attaching the second film onto the first film so that the absorption axis of the polarizing plate is vertical to the transmission axis of the brightness improving film.

In the present exemplary embodiment, the forming of the film laminated body may include supplying the second film in a second direction vertical to a first direction, wherein the first direction is a carrying direction of the first film.

In the present exemplary embodiment, the forming of the film laminated body may include, when a defect is formed in a facing region of the first film facing the second film, carrying the first film so that the defect is not included in the facing region of the first film, and attaching the second film onto the first film.

In the present exemplary embodiment, the forming of the film laminated body may include unwinding the second film from a second film roll, and carrying the second film in the second direction.

In the present exemplary embodiment, the forming of the film laminated body may include attaching a second film sheet piece formed by forming a cutting line in the second film, which is carried in the second direction, in a width direction at intervals along a longitudinal direction, onto the first film.

In the present exemplary embodiment, the method may further include: unwinding a third film from a third film roll, and carrying the third film; forming a cutting line in the third film in a width direction at intervals along a longitudinal direction, and forming a third film sheet piece; and laminating the third film sheet piece onto a second surface of the panel.

In the present exemplary embodiment, any one of the first film and the second film may be a polarizing film including a light source side polarizing plate, and the other may be an optical film including at least one of a brightness improving film, a light collecting sheet, and a diffusion film, and the third film may be a polarizing film including a screen side polarizing plate.

A system for manufacturing a display unit according to an exemplary embodiment of another aspect of the present invention includes: a panel transferring line, which transfers a panel; a first film carrying line, which unwinds a first film from a first film roll, and carries the first film; a film laminated body forming unit, which attaches a second film onto the carried first film and forms an elongated film laminated body; a film laminated body carrying line, which carries the film laminated body; a film sheet piece forming unit, which forms a cutting line in the film laminated body in a width direction at intervals along a longitudinal direction and forms a film sheet piece; and a first laminating unit, which laminates the film sheet piece on a first surface of a panel.

In the present exemplary embodiment, any one of the first film and the second film may be a polarizing film including a polarizing plate, and the other may be an optical film including at least one of a brightness improving film, a light collecting sheet, and a diffusion film.

In the present exemplary embodiment, any one of the first film and the second film may be a polarizing film including a polarizing plate having an absorption axis, and the other may be an optical film including a brightness improving film having a transmission axis, and the film laminated body forming unit may attach the second film onto the first film so that the absorption axis of the polarizing plate is vertical to the transmission axis of the brightness improving film.

In the present exemplary embodiment, the film laminated body forming unit may include a second film supplying unit, which supplies the second film in a second direction vertical to a first direction, which is a carrying direction of the first film.

In the present exemplary embodiment, when a defect is formed in a facing region of the first film facing the second film, the film laminated body forming unit may carry the first film so that the defect is not included in the facing region of the first film and attach the second film onto the first film.

In the present exemplary embodiment, the second film supplying unit may unwind the second film from a second film roll, and carry the second film in the second direction.

In the present exemplary embodiment, the film laminated body forming unit may include a second film sheet piece forming unit, which forms a cutting line in the second film in a width direction at intervals along a longitudinal direction, and forming a second film sheet piece, and a film attaching unit, which attaches the second film sheet piece onto the first film.

In the present exemplary embodiment, the system may further include: a third film carrying line which unwinds a third film from a third film roll, and carries the third film; a third film sheet piece forming unit, which forms a cutting line in the third film in a width direction at intervals along a longitudinal direction, and forms a third film sheet piece; and a second laminating unit, which laminates the third film sheet piece on a second surface of the panel.

In the present exemplary embodiment, any one of the first film and the second film may be a polarizing film including a light source side polarizing plate, and the other may be an optical film including at least one of a brightness improving film, a light collecting sheet, and a diffusion film, and the third film may be a polarizing film including a screen side polarizing plate.

According to the exemplary embodiments of the present invention, it is possible to form a film laminated body by attaching a second film onto a first film, which is continuously carried in one manufacturing line, form a film sheet piece by a cutting line, and then laminate the film sheet piece on a first surface of a panel.

Accordingly, according to the exemplary embodiment of the present invention, compared to the case where a film laminated body is supplied through a film laminated body roll having a form in which a first film and a second film are laminated in advance and are wound, it is possible to prevent a problem in that a quality of the film laminated body is degraded due to deformation by curling or pressing.

According to the exemplary embodiment of the present invention, there is an advantage in that it is possible to configure a first film carrying line and a second film carrying line to be short, compared to the conventional scheme, in which a first film and a second film are separately supplied and are sequentially attached.

According to the exemplary embodiment of the present invention, a process of peeling a surface protecting film from a first film may be continuously performed during a process of attaching a second film to the first film, so that it is possible to prevent an increase in a processing time, compared to the case where a first film is attached and then a surface protecting film in the form of a sheet piece is peeled from the first film in the form of a sheet piece and a second film is attached, in the related art, and a probability in that foreign substances are introduced is decreased according to the short processing time.

DETAILED DESCRIPTION

The present invention will become clearer when referring to the exemplary embodiments described below in detail with reference to the accompanying drawings. However, the present invention is not limited to exemplary embodiments disclosed herein but will be implemented in various forms, and the exemplary embodiments are provided so that the present disclosure is completely disclosed, and a person of ordinary skilled in the art can fully understand the scope of the present disclosure, and the present disclosure will be defined only by the scope of the appended claims. In the meantime, terms used in the present specification are for describing the exemplary embodiments, and do not intend to limit the present invention. In the present specification, a singular form includes a plural form as well, unless otherwise mentioned. A term "comprises" and/or "comprising" does not exclude the existence or an addition of one or more other constituent elements, steps, operations, and/or elements, in addition to the mentioned constituent element, step, operation, and/or element. Terms, such as "a first" and "a second", may be used for describing various constituent elements, but the constituent elements shall not be limited by the terms. The terms are used only to discriminate one constituent element from another constituent element.

Hereinafter, the present invention will be described in detail with reference to the accompanying drawings.

Figure 1:
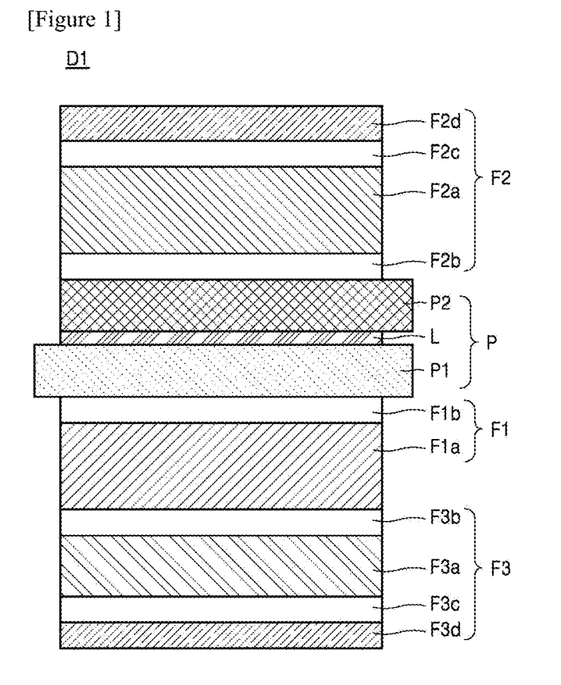
FIG. 1 is a schematic diagram schematically illustrating a partial structure of one aspect of a display unit.

FIG. 1 is a schematic diagram schematically illustrating a partial structure of one aspect of a display unit.

One aspect of a display unit D1 may be a liquid crystal display unit. In a panel P, a first surface P1 may be a non-viewed side and may be formed of a thin film transistor substrate. A second surface P2 may be a viewed side and may be formed of a color filter substrate, and a liquid crystal layer L may be disposed between the thin film transistor substrate and the color filter. The liquid crystal display unit may include a backlight light source unit (not illustrated) emitting light to the first surface P1 side of the panel P.

A first polarization film F1 may be disposed on the first surface P1 of the panel. The first polarization film F1 may have a laminated body structure including an adsorption type polarizing plate F1a and an adhesive layer F1b. The first polarization film F1 may be joined to the first surface P1 side of the panel through the adhesive layer F1b.

The second polarization film F2 may be disposed on the second surface P2 of the panel. The second polarization film F2 may have a laminated body structure including an adsorption type polarizing plate F2a, adhesive layers F2b and F2c disposed on both surfaces of the adsorption type polarizing plate F2a, and a surface protecting film F2d disposed on any one adhesive layer F2c. The second polarization film F2 may be joined to the second surface P2 side of the panel through the adhesive layer F2b positioned on the surface of the second polarization film F2 opposite to the surface protecting film F2d.

An optical film F3 may be disposed on a surface opposite to the surface facing the first surface P1 of the panel on the first polarization film F1. The optical film F3 may have a laminated body structure including at least one functional layer F3a, chosen from among a brightness improving film, a light collecting sheet, and a diffusion film, in order to efficiently use light emitted from a backlight light source unit. The optical film F3 may include adhesive layers F3b and F3c disposed on both surfaces of the functional layer F3a and a surface protecting film F3d disposed on any one adhesive layer F3c.

Figure 2:
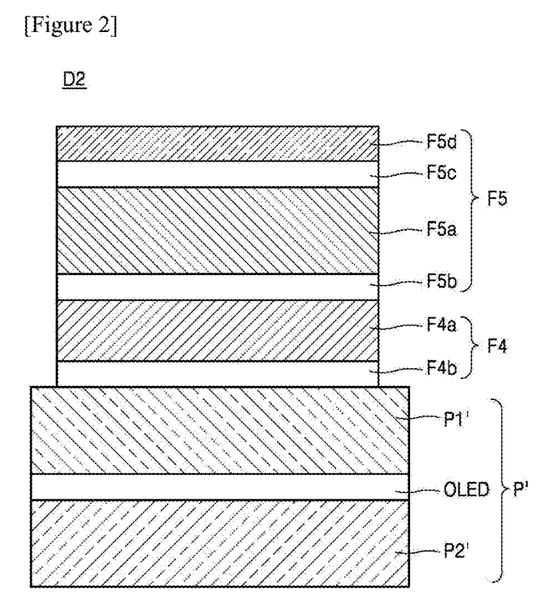
FIG. 2 is a schematic diagram schematically illustrating a partial structure of another aspect of a display unit.

FIG. 2 is a schematic diagram schematically illustrating a partial structure of another aspect of a display unit.

One aspect of a display unit D2 may be an organic EL display unit, and in a panel P', a first surface P1' is formed of a viewed side substrate, and a second surface P2' is formed of a non-viewed side substrate, and an OLED layer may be disposed between the viewed side substrate and the non-viewed side substrate. The organic EL display unit does not include a light source unit for emitting light to the second surface P2' side of the panel P'.

An optical film F4 may be disposed on the first surface P1' of the panel. The optical film F4 may have a laminated body structure including a phase difference film F4a for delaying a phase of light emitted from the OLED layer, and an adhesive layer F4b. A first polarization film F1 may be joined to the first surface P1' side of the panel through the adhesive layer F1b.

A polarization film F5 may be disposed on a surface opposite to the surface facing the first surface P1' of the panel on the optical film F4. The polarization film F5 may have a laminate body structure including an adsorption type polarizing plate F5a, adhesive layers F5b and F5c disposed on both surfaces of the adsorption type polarizing plate F5a, and a surface protecting film F5d disposed on any one adhesive layer F5c. The polarization film F5 may be joined onto the optical film F4 through the adhesive layer F5b disposed on the surface opposite to the surface protecting film F5d.

Figure 3:
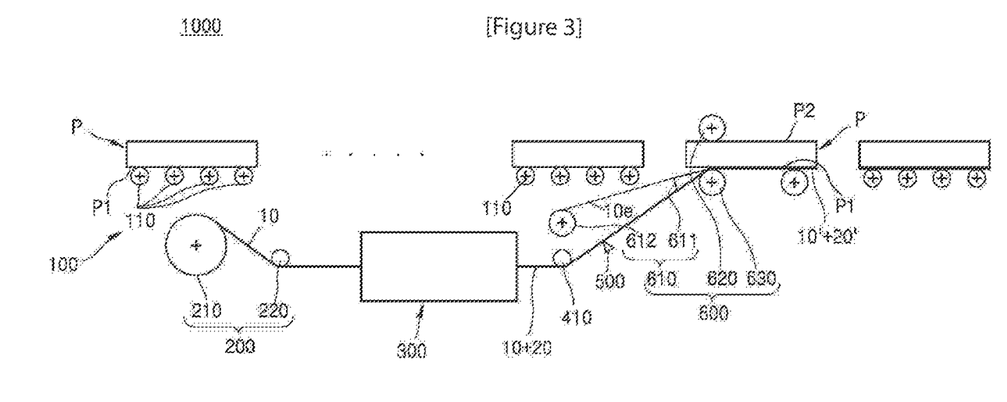
FIG. 3 is a lateral view schematically illustrating a part of a display unit manufacturing system, in which a display unit manufacturing method is used, according to one aspect of the present invention.
Figure 4:
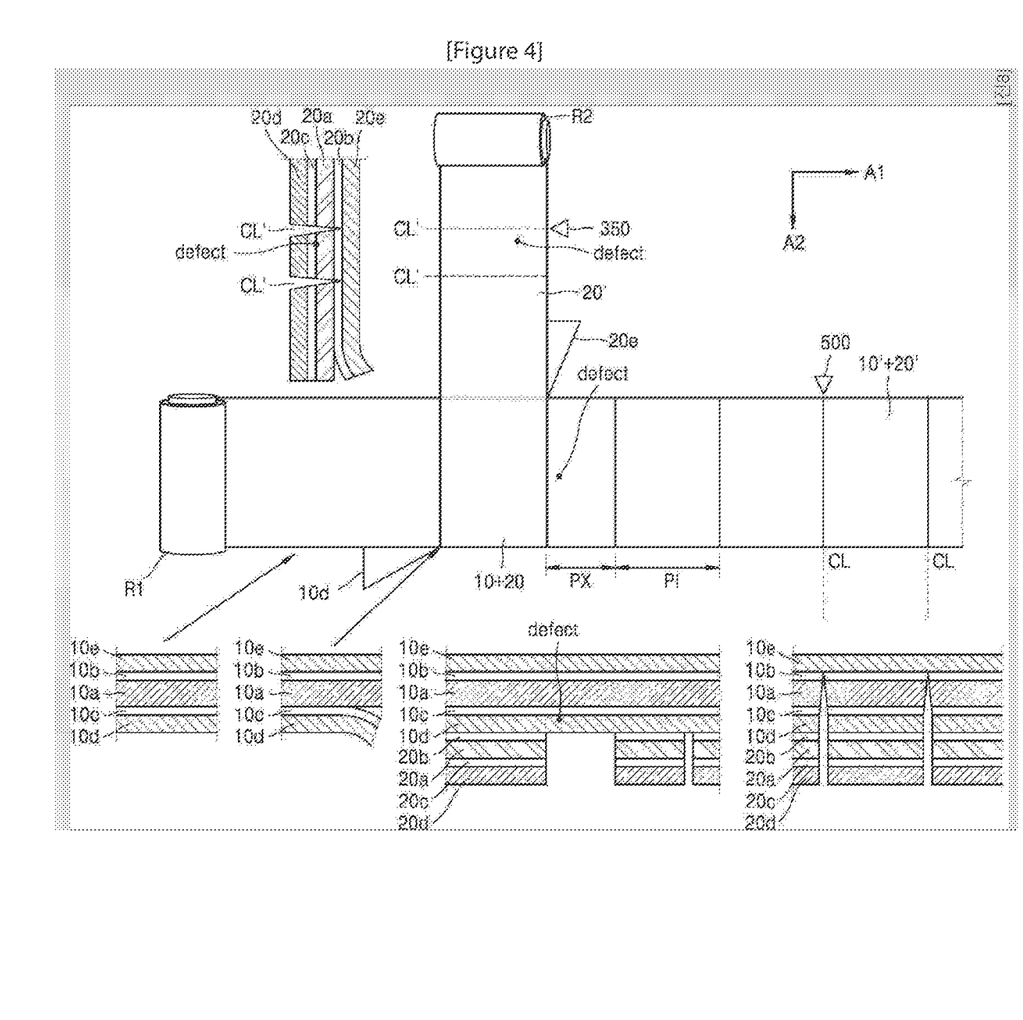
FIG. 4 is a diagram schematically illustrating a process of forming a film laminated body and a film sheet piece according to one aspect of the present invention and illustrating structures of a first film, a second film, and a film laminated body in the process in cross-sectional forms.

FIG. 3 is a lateral view schematically illustrating a part of a display unit manufacturing system, in which a display unit manufacturing method is used, according to one aspect of the present invention, and FIG. 4 is a diagram schematically illustrating a process of forming a film laminated body and a film sheet piece according to one aspect of the present invention and illustrating structures of a first film, a second film, and a film laminated body in the process, in cross-sectional forms. FIGS. 5A-5C are a schematic diagrams schematically illustrating operation processes of a film laminated body forming unit according to certain aspects of the present invention, and FIG. 6 is a top plan view schematically illustrating a part of a display unit manufacturing system, in which a method for manufacturing a liquid crystal display unit is used, according to an exemplary embodiment of one aspect of the present invention and a schematic diagram illustrating a laminated structure of a panel or a film on the manufacturing system (an adhesive layer is not illustrated in FIG. 6).

A display unit manufacturing method according to one aspect of the present invention relates to a method for manufacturing a display unit by laminating a film on at least one surface between a first surface and a second surface of a panel. The display unit manufacturing method may be used for manufacturing a liquid crystal display unit and an organic EL display unit, but will be described based on a liquid crystal display unit for convenience of the description.

The display unit manufacturing method may include: unwinding a first film 10 from a first film roll R1, in which the elongated first film 10 is wound, carrying the first film 10, attaching a second film 20 onto the carried first film 10, forming an elongated film laminated body 10+20, forming a cutting line CL in the film laminated body 10+20 in a width direction at intervals along a longitudinal direction, forming a film sheet piece 10'+20', and laminating the film sheet piece 10'+20' onto the first surface P1 of the panel.

Any one of the first film 10 and the second film 20 may be a polarization film including a polarizing plate, and another one film may be an optical film including at least one of a brightness improving film, a light collecting sheet, a diffusion film, and a phase difference film.

The present invention will be described based on the case where the display unit manufactured according to one aspect of the present invention is a liquid crystal display unit, the first film 10 is a polarizing film including a polarizing plate 10a, and the second film 20 is an optical film including a brightness improving film 20a, as an example.

The first film 10 is a laminated body structure including the polarizing plate 10a, adhesive layers 10b and 10c disposed on both surfaces of the polarizing plate 10a, a surface protecting film 10d disposed on any one adhesive layer 10c, and a first carrier film 10e disposed on the other adhesive layer 10*b*, and is wound in the form of the first film roll R1 to be prepared in a display unit system 1000.

The second film 20 may be a laminated body structure including a brightness improving film 20*a*, adhesive layers 20*b* and 20*c* disposed on both surfaces of the brightness improving film 20*a*, a surface protecting film 20*d* disposed on any one adhesive layer 20*c*, and a second carrier film 20*e* disposed on the other adhesive layer 20*b*. The second film 20 may be prepared in the form of a sheet piece cut in a shape corresponding to a surface of the panel P, not in an elongated form, but it is preferred that the second film 20 is wound in the form of a second film roll R2 in a dimension for improving process efficiency according to a continuous process to be prepared in the display unit system 1000.

In the carried first film 10, the surface protecting film 10*d* may be peeled together with the adhesive layer 10*c* by a surface protecting film peeling unit (not illustrated).

In the second film 20, the second carrier film 20*e* may be peeled by a carrier film peeling unit.

Each of the surface protecting film peeling unit (not illustrated) and the carrier film peeling unit may have an edge portion having an acute angle so that the surface protecting film or the carrier film may be folded back and wound.

The forming of the film laminated body may include attaching the second film 20 onto the first film 10 so that an absorption axis of the polarizing plate 10*a* on the first film 10 is vertical to a transmission axis of the brightness improving film 20*a* on the second film 20. The absorption axis of the polarizing plate 10*a* and the transmission axis of the brightness improving film 20*a* may be parallel to each other when a longitudinal direction of the first film 10 and a longitudinal direction of the second film 20 are disposed in parallel. For example, the absorption axis of the polarizing plate 10*a* may be formed in the longitudinal direction of the first film 10, and the transmission axis of the brightness improving film 20*a* may be formed in the longitudinal direction of the second film 20. In order to make the absorption axis of the polarizing plate 10*a* on the first film 10 be arranged to be vertical to the transmission axis of the brightness improving film 20*a* on the second film 20, it is preferred that a first direction A1, which is a carrying direction of the first film 10, is perpendicular to a second direction A2, which is a carrying direction of the second film 20, as illustrated in FIG. 4. That is, it is preferred that the second film 20 is supplied in the second direction A2 that is perpendicular to the first direction A1, which is the carrying direction of the first film 10. More particularly, in the forming of the film laminated body, the second film 20 may be unwound from the second film roll R2, in which the elongated second film 20 is wound, and carried in the second direction A2.

The forming of the film laminated body may include forming a cutting line CL' in the second film 20, which is carried in the second direction A2, in a width direction at a predetermined interval along a longitudinal direction before the second carrier film 20*e* is peeled and attaching a formed second film sheet piece 20' onto the first film 10. In the present specification, the term "cutting line" means a cutting line formed by half-cutting, in which the film is cut from one surface, but the carrier film or the surface protecting film may be maintained in a continuous state, not by full-cutting in which one surface to the other surface of the film is completely cut. That is, the cutting for forming the second film sheet piece 20' means half-cutting the cutting line CL', in which the film is cut from the surface protecting film 20*d* side, but the second carrier film 20*e* is maintained in a continuous state. Herein, when a defect is included on the second film 20, it is preferred that the cutting line CL' is formed at a position at a small distance from the position of the defect, in consideration of the position of the defect. This is for the purpose of excluding a region including the defect, and attaching only the second film 20 in a normal region onto the first film 10, and minimizing loss of film. In the case of one example of a process of identifying whether the defect is included and skipping the defect, the defect may be detected by a photographing device (not illustrated) during a process of manufacturing the second film roll R2, location information on the defect may be made in the form of data, the defect data may be marked on the second film 20 in the form of a barcode in advance, the barcode information may be identified by the display unit manufacturing system 1000, and the second carrier film 20*e* may be wound without peeling the second carrier film 20*e* so that the region including the defect is not attached onto the first film 10 or even though the second carrier film 20*e* is peeled, the second carrier film 20*e* may be attached onto the second film 20 again and wound.

In the case of another example of a process of identifying whether the defect is included and skipping the defect, the defect may be detected by a photographing device (not illustrated) in the display unit manufacturing system 1000, and the second carrier film 20*e* may be wound without peeling the second carrier film 20*e* so that the region including the defect is not attached onto the first film 10 or even though the second carrier film 20*e* is peeled, the second carrier film 20*e* may be attached onto the second film 20 again and wound.

In a region, in which the first film 10 and the second film 20 cross so as to be attached to each other, a plate 320 for supporting the first film 10 may be disposed on a surface of the first film 10 opposite to a surface facing the second film 20 (FIGS. 5A-5C). The plate 320 is the adsorption type plate 320, and may fix a position of the first film 10 during the process of attaching the second film 20. As the adsorption scheme, a publicly known technical configuration may be used.

When one end portion 201 of the second film 20 is disposed at one end portion 101 side in the width direction of the first film 10 in the state where the second carrier film 20*e* is peeled, an attaching roller 330 moves toward the other end portion 102 side in the width direction of the first film 10 while pressing the one end portion 201 toward the one end portion 101 side in the width direction of the first film 10 and attaches the second film 20 onto the first film 10 (see FIGS. 5A-5C). Then, the first film 10 may be carried by a predetermined pitch, for example, a distance calculated based on a length of a long side or a short side of the panel and stopped. Then, the process in the order illustrated in FIGS. 5A-5C may be repeated.

In this case, an edge portion 311 of the carrier film peeling unit 310 may reciprocate between the one end portion 101 side and the other end portion 102 side in the width direction of the first film 10 so as to be parallel to the second direction A2, which is the carrying direction of the second film 20. For example, the edge portion 311 of the carrier film peeling unit 310 may be synchronized with a movement of the attaching roller 330 and reciprocate between the one end portion 101 side and the other end portion 102 side in the width direction of the first film 10 (FIGS. 5A-5C).

In the forming of the film laminated body, when a defect is formed on a facing region of the first film 10 facing the second film 20, the second film 20 may be attached onto the first film 10 after the first film 10 is carried so that the defect is not included on the facing region of the first film 10. The first film 10 may include the defect caused by the introduction of foreign substances and bubbles to a space between the layers during the process of manufacturing the first film 10 in the laminated body structure, or scratch, deformation, and the like during the manufacturing, storing, and carrying process. When the second film 20 is attached to the region of the first film 10 including the defect as it is, it is necessary to perform a rework operation of excluding the attachment of a defective section to the surface of the panel P, or when the defective section has been attached to the surface of the panel P, it is necessary to perform a rework operation of peeling the defective section and re-using the panel P later. When the normal region having no defect based on the second film 20 is finally used, the defect exists based on the first film 10, so that the defective region is excluded or removed, which finally causes waste of the second film 20. Accordingly, it is necessary to detect whether a defect is included in the first film 10 and attach the second film 20 to a region, in which the defect is skipped. In the case of one example of a process of identifying whether the defect is included and skipping the defect, the defect may be detected by a photographing device (not illustrated) during a process of manufacturing the first film roll R1, location information on the defect may be made in the form of data, the defect data may be marked on the first film 10 in the form of a barcode in advance, the barcode information may be identified by the display unit manufacturing system 1000, and the first film 10 may be carried with a longer pitch p1+px than a general carrying pitch p1 so that the region including the defect does not face an upper surface of the second film 20. In the case of another example of a process of identifying whether the defect is included and skipping the defect, the defect may be detected by a photographing device (not illustrated) in the display unit manufacturing system 1000, and when a region including the defect faces an upper surface of the second film 20, the first film 10 may be carried with a longer pitch p1+px than a general carrying pitch p1.

Accordingly, the film laminated body 10+20 formed by the forming of the film laminated body is in a state where the first film 10 in the state where the surface protecting film 10*d* is peeled is attached to the second film 20 in the state where the second carrier film 20*e* is peeled, so that the film laminated body 10+20 may have the structure, in which the first carrier film 10*e*, the polarizing plate 10*a*, the brightness improving film 20*a*, and the surface protecting film 20*d* are sequentially laminated. The adhesive layers 10*b*, 20*b*, and surface protecting film 20*d* may be disposed between the adjacent films (including the polarizing plate).

The forming of the film sheet piece may include forming the film sheet piece 10'+20' by forming the cutting line CL in the film laminated body 10+20 in the width direction at intervals at a distance calculated based on a length, such as calculated based on the length of the long side or the short side of the panel P in the longitudinal direction. In order to form the cutting line CL, the surface protecting film 20*d* side is cut by using a cutting means, and using the half cutting scheme, in which the second carrier film 20*e* is left so as to maintain a continuous state, may be used. The position, at which the cutting line CL is formed, may be formed to be adjacent to a boundary of the second film 20 joined onto the first film 10. Accordingly, the film sheet piece 10'+20' may have the structure, in which the polarizing plate 10*a*, the brightness improving film 20*a*, and the surface protecting film 20*d* are sequentially laminated. The adhesive layers 10*b*, 20*b*, and 20*d* may be disposed between the adjacent films (including the polarizing plate) and at one side of the polarizing plate 10*a*.

The laminating of the film sheet piece may include laminating the film sheet piece 10'+20', in which the first carrier film 10*e* is peeled from the film laminated body 10+20, on the first surface P1 of the panel P.

In the meantime, in the case of an exemplary embodiment, in which an organic EL display unit is manufactured by the display unit manufacturing method, a first film may be an optical film including a phase difference film and a second film may be an optical film including a polarizing plate.

The exemplary embodiment, in which a liquid crystal display unit is manufactured, may further include unwinding a third film 30 from a third film roll R3, in which an elongated third film 30 is wound, and carrying the third film 30, forming a third film sheet piece by forming a cutting line in the third film 30 in a width direction at intervals in a longitudinal direction, and laminating a third film sheet piece 30' on a second surface P2 of the panel (FIG. 6).

Any one of the first film 10 and the second film 20 is a polarizing film including a light source side polarizing plate, the other is an optical film including at least one of a brightness improving film, a light collecting sheet, and a diffusion film, and the third film 30 may be a polarizing film including a screen side polarizing plate.

Particularly, along with the foregoing exemplary embodiment, the present invention will be described based on the case where the first film 10 is a polarizing film including the polarizing plate 10*a*, particularly, a light source side polarizing plate 10*a*, the second film 20 is an optical film including a brightness improving film 20*a*, and the third film 30 is a polarizing film including a screen side polarizing plate 30*a* as an example.

The third film 30 has a laminated body structure including the screen side polarizing plate 30*a*, two adhesive layers (not illustrated) disposed on both surfaces of the polarizing plate 30*a*, respectively, a surface protecting film 30*d* disposed on any one adhesive layer, and a third carrier film 30*e* disposed on the other adhesive layer, and the third film 30 may be wound in the form of a third film roll R3 and prepared in the display unit system 1000.

The forming of the third film sheet piece may include forming the third film sheet piece 30' by forming a cutting line CL" in the third film 30 in the width direction at intervals by a distance calculated based on a length calculated based on the length of the long side or the short side of the panel P in a longitudinal direction. In order to form the cutting line CL", the surface protecting film 30*d* side is cut by using a cutting means, using the half cutting scheme, in which the third carrier film 30*e* is left so as to maintain a continuous state, may be used.

In the meantime, a width of any one of the first film 10 and the third film 30 may correspond to a length of any one of the long side and the short side of the panel P, and a width of the other may correspond to a length of the remaining one between the long side and the short side of the panel P. For example, when a width of the first film 10 corresponds to the length of the long side of the panel P, a width of the third film 30 may correspond to the length of the short side of the panel P. In this case, a width of the second film 20 may correspond to the length of the short side of the panel P similar to the width of the third film 30. In the exemplary embodiment, the cutting line CL for forming the film sheet piece 10'+20' from the film laminated body 10+20 is formed in the width direction at intervals corresponding to the length of the short side of the panel P, and the cutting line CL" for forming the third film sheet piece 30' from the third film 30 may be formed in the width direction at intervals corresponding to the length of the long side of the panel P.

The laminating of the third film sheet piece may include laminating the film sheet piece 30', in which the third carrier film 30e is peeled from the third film 30 on the second surface P2 of the panel P.

Accordingly, it is possible to manufacture the liquid crystal display unit in the form, in which at least the light source side polarizing plate 10a and the functional optical film 20a are laminated on the first surface P1 of the panel P, and at least the screen side polarizing plate 30a is laminated on the second surface P2 of the panel P.

Hereinafter, a display unit manufacturing system 1000 according to another aspect of the present invention will be described.

The display unit manufacturing system 1000 may include a panel transferring line 100 (FIG. 3), which transfers a panel P, a first film carrying line 200, which unwinds a first film 10 from a first film roll R1, in which the elongated first film 10 is wound, and carries the first film 10, a film laminated body forming unit 300 (FIG. 3), which attaches a second film 20 onto the carried first film 10 and forms an elongated film laminated body 10+20, a film laminated body carrying line 400, which carries the film laminated body 10+20, a film sheet piece forming unit 500, which forms a cutting line CL in the film laminated body 10+20 in a width direction at intervals along a longitudinal direction and forms a film sheet piece 10'+20', and a first laminating unit 600 (FIG. 3), which laminates the film sheet piece 10'+20' on the first surface P1 of the panel P.

The panel transferring line 100 may include a plurality of transferring rollers 110, which is capable of supporting at least one surface of the first surface P1 and the second surface P2 of the panel P and carrying the panel P in one direction by a rotation.

The first film carrying line 200 may include a first unwinding roll 210, which is mounted with the first film roll R1 and unwinds the first film roll R1, and a plurality of transferring rollers 220, which applies tension to the unwound first film 10 and carries the first film 10 in one direction by a rotation.

The film laminated body forming unit 300 is a device, which is capable of attaching the second film 20 onto the first film so that an absorption axis of the polarizing plate 10a on the first film 10 is vertical to a transmission axis of a brightness improving film on the second film 20, and may include a surface protecting film peeling unit (not illustrated), a second film supplying unit may include a second unwinding roll 341 a second film sheet piece forming unit 350, a carrier film peeling unit 310, a plate 320, and a film attaching unit 330.

The surface protecting film peeling unit is a device, which is capable of peeling a surface protecting film 10d from the first film 10 and collecting the surface protecting film 10d, and may include an edge portion (not illustrated), which allows the surface protecting film 10d to be folded back, and a winding roll (not illustrated), which is capable of winding the peeled surface protecting film 10d.

The second unwinding roll 341 of the second film supplying unit is mounted with the second film roll R2 and unwinds the second film roll R2, and a plurality of transferring rollers (not illustrated), which applies tension to the unwound second film 20 and carries the second film 20 in one direction by a rotation. The second unwinding roll 341 of the second film supplying unit may supply the second film 20 in a second direction A2 vertical to a first direction A1, which is a carrying direction of the first film 10.

The second film sheet piece forming unit 350 is a device, which is capable of forming a second film sheet piece 20' by forming a cutting line CL' in the second film 20, which is carried in the second direction A2, at intervals in a longitudinal direction, and a circular blade of a knife, a laser device, and the like may be used, and as long as a means is capable of forming the cutting line, the means may be available.

The carrier film peeling unit 310 is a device, which is capable of peeling the second carrier film 20e from the second film 20 and collecting the second carrier film 20e, and may include an edge portion 311, which allows the second carrier film 20e to be folded back, and a winding roll (not illustrated), which is capable of winding the peeled second carrier 20e. The edge portion 311 of the carrier film peeling unit 310 may reciprocate between the one end portion 101 side and the other end portion 102 side in the width direction of the first film 10 so as to be parallel to the second direction A2, which is the carrying direction of the second film 20. For example, the edge portion 311 of the carrier film peeling unit 310 may be synchronized with a movement of an attaching roller 330 and reciprocate between the one end portion 101 side and the other end portion 102 side in the width direction of the first film 10 (FIGS. 5A-5C).

Figure 5:
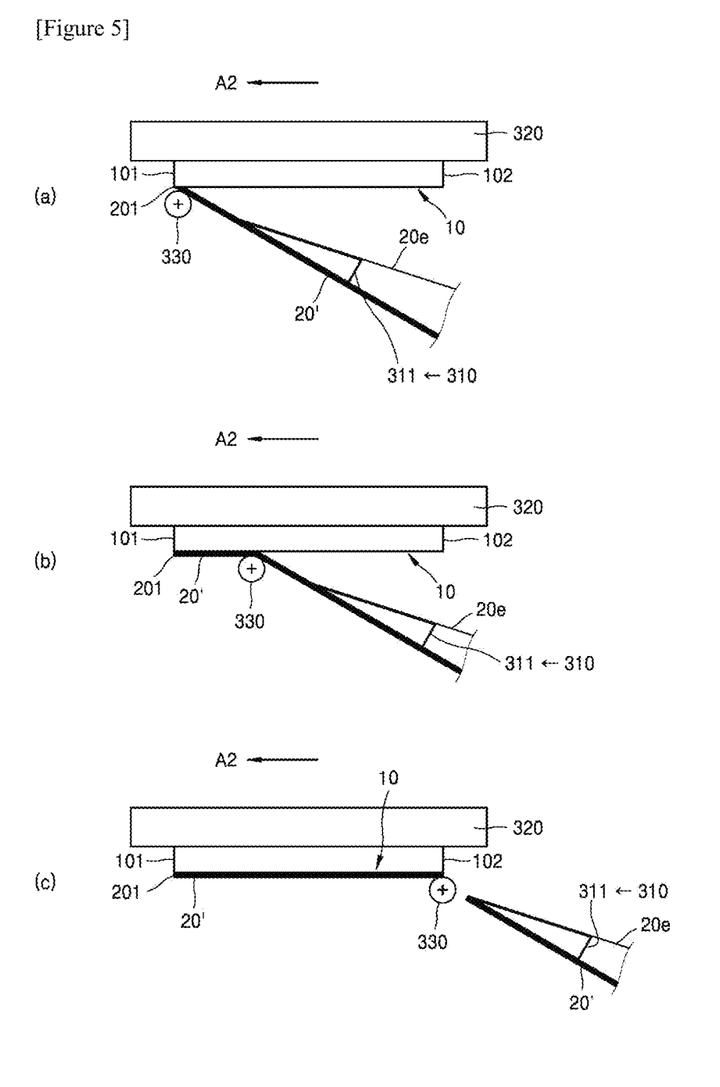
FIG. 5A is a schematic diagram schematically illustrating a first operation of a process of a film laminated body forming unit according to one aspect of the present invention.
FIG. 5B is a schematic diagram schematically illustrating a second operation of a process of a film laminated body forming unit according to one aspect of the present invention.
FIG. 5C is a schematic diagram schematically illustrating a third operation of a process of a film laminated body forming unit according to one aspect of the present invention.
Figure 6:
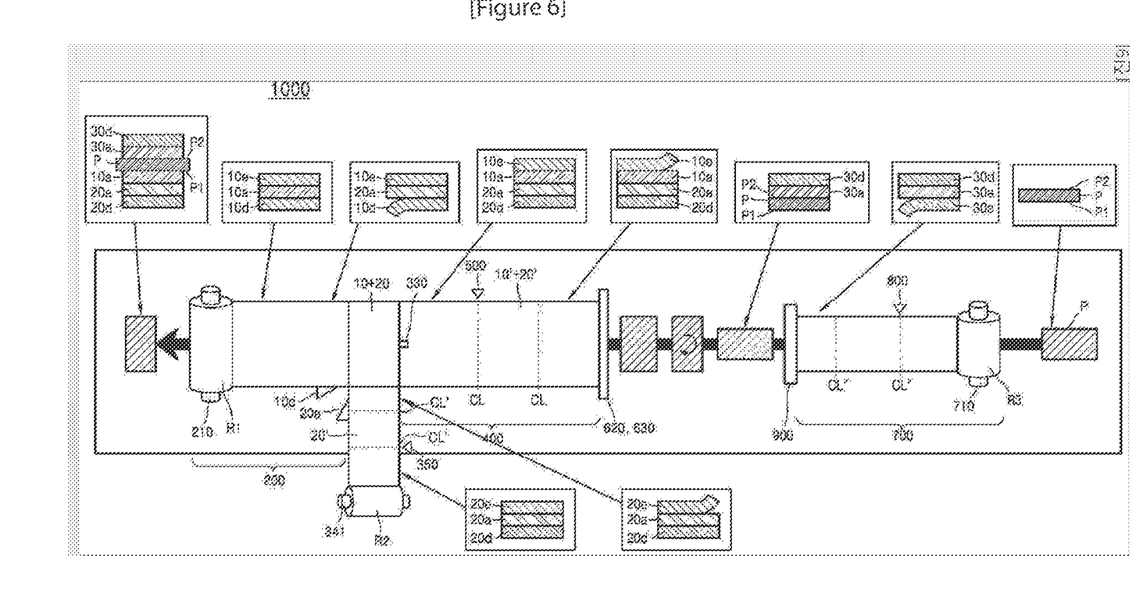
FIG. 6 is a top plan view schematically illustrating a part of a display unit manufacturing system, in which a method for manufacturing a liquid crystal display unit is used, according to an exemplary embodiment of one aspect of the present invention and a schematic diagram schematically illustrating a laminated structure of a panel or a film on the manufacturing system.

The film attaching unit 330 is a device, which is capable of attaching the second film sheet piece 20' onto the first film 10, and may include the attaching roller 330, which attaches the second film 20 onto the first film 10 while pressing one end portion 201 of the second film 20 toward the one end portion 101 side in the width direction of the first film 10 and moving toward the other end portion side 202 in a width direction of the second film 20 when the one end portion 201 of the second film 20 in the state where the second carrier film 20e is peeled is disposed at the one end portion 101 side in the width direction of the first film 10 (see (a) to (c) of FIG. 5).

When a defect is formed on a facing region of the first film 10 facing the second film 20, the film laminated body forming unit 300 may be controlled so as to attach the second film 20 on to the first film 10 after the first film 10 is carried so that the defect is not included to the facing region of the first film 10.

The film laminated body carrying line 400 may include a plurality of transferring rollers 410, which is capable of applying tension to a film laminated body 10+20 and carrying the film laminated body 10+20 in one direction by a rotation.

The film sheet piece forming unit 500 is a device, which is capable of forming a film sheet piece 10'+20' by forming a cutting line CL in the carried film laminated body 10+20 at intervals along a longitudinal direction, and a circular blade of a knife, a laser device, and the like may be used, and as long as a means is capable of forming the cutting line, that means may be used.

The first laminating unit 600 may include a carrier film peeling unit 610, which peels the first carrier film 10e from the film laminated body 10+20 and a pair of attaching rolls 620 and 630, which are vertically spaced apart from each other (FIG. 3). The carrier film peeling unit 610 may include an edge portion 611 having an acute angle so that the first carrier film 10e is folded back and wound, and a winding roll 612, which winds the first carrier film 10e. The panel P and the film sheet piece 10'+20', in which the first carrier film 10e is peeled, may be inserted into a space between the pair of attaching rolls 620 and 630 so that the film sheet piece 10'+20' may be laminated on the first surface P1 of the panel P.

The display unit manufacturing system 1000 may include a third film carrying line 700, which unwinds a third film 30 from a third roll R3, in which an elongated third film 30 is wound, and carries the third film 30, a third film sheet piece forming unit 800, which forms a third film sheet piece 30' by forming a cutting line CL" in the third film 30 in a width direction at intervals in a longitudinal direction, and a second laminating unit 900, which laminates the third film sheet piece 30' on the second surface P2 of the panel P.

The third film carrying line 700 may include a third unwinding roll 710, which is mounted with the third film roll R3 and unwinds the third film roll R3, and a plurality of transferring rollers (not illustrated), which is capable of applying tension to the unwound third film 30 and carrying the third film 30 in one direction by a rotation.

The third film sheet piece forming unit 800 is a device, which is capable of forming a third film sheet piece 30' by forming a cutting line CL" in the third film 30, which is carried in the longitudinal direction, at intervals in a longitudinal direction, and a circular blade of a knife, a laser device, and the like may be used, and as long as a means is capable of forming the cutting line, that means may be used.

The second laminating unit 900 may include a carrier film peeling unit (not illustrated), which peels a third carrier film 30e from the third film 30, and a pair of attaching rolls, which are vertically spaced apart from each other. The carrier film peeling unit may include an edge portion having an acute angle so that the third carrier film 30e is folded back and wound, and a winding roll, which winds the third carrier film 30e. The panel P and the third film sheet piece 30' may be inserted into a space between the pair of attaching rolls, so that the third film sheet piece 30' may be laminated on the second surface P2 of the panel P.

The second laminating unit 900 may include the pair of attaching rolls, which are spaced apart from each other, and the panel P and the third film sheet piece 30' may be inserted into a space between the pair of attaching rolls, so that the third film sheet piece 30' may be laminated on the second surface P2 of the panel P.

According to the method and system for manufacturing the display unit according to the present invention, it is possible to form a film laminated body by attaching a second film onto a first film, which is continuously carried in one manufacturing line, form a film sheet piece by a cutting line, and then laminate the film sheet piece on a first surface of a panel.

Accordingly, according to the exemplary embodiment of the present invention, compared to the case where a film laminated body is supplied through a film laminated body roll having the form, in which a first film and a second film are laminated in advance and are wound, it is possible to prevent a problem in that a quality of a film laminated body is degraded due to deformation by curling or pressing.

According to the exemplary embodiment of the present invention, there is an advantage in that it is possible to configure a first film carrying line and a second film carrying line to be short, compared to the scheme, in which a first film and a second film are separately supplied and are sequentially attached.

According to the exemplary embodiment of the present invention, a process of peeling a surface protecting film from a first film may be continuously performed during a process of attaching a second film to the first film, so that there are advantages in that it is possible to prevent an increase in a processing time, compared to the case where a first film is attached and then a surface protecting film in the form of a sheet piece is peeled from the first film in the form of a sheet piece and a second film is attached in the related art, and a probability in that foreign substances are introduced is decreased according to the short processing time.

Although the present invention has been described in relation to the mentioned exemplary embodiment, various corrections or modifications may be made without departing from the principles or spirit of the invention. Accordingly, as long as the corrections or the modifications belong to the principle of the present invention, the corrections or the modifications may be included in the scope of the accompanying claims.

The invention claimed is:

1. A method for manufacturing a display unit, the method comprising:
   unwinding a first film from a first film roll, and carrying the first film in a first carrying direction;
   unwinding a second film from a second film roll positioned perpendicular to the first film roll, and carrying the second film in a second carrying direction that is perpendicular to the first carrying direction;
   attaching the second film onto the carried first film, wherein, as a result of the first carrying direction of the first film and the second carrying direction, the second film is attached to the first carried film so that an absorption axis of a polarizing plate on the first film is perpendicular to a transmission axis of a brightness improving film on the second film, and forming an elongated film laminated body;
   forming a cutting line in the film laminated body in a width direction at intervals in a longitudinal direction and forming a film sheet piece; and
   laminating the film sheet piece onto a first surface of a panel.

2. The method for claim 1, wherein the forming of the film laminated body includes, when a defect is formed in a facing region of the first film facing the second film, carrying the first film so that the defect is not included in the facing region of the first film and attaching the second film onto the first film.

3. The method for claim 1, wherein the forming of the film laminated body includes attaching a second film sheet piece formed by forming a cutting line in the second film, which is carried in the second carrying direction, in a width direction at intervals along a longitudinal direction onto the first film.

4. The method for claim 1, further comprising:
   unwinding a third film from a third film roll, and carrying the third film;
   forming a cutting line in the third film in a width direction at intervals along a longitudinal direction and forming a third film sheet piece; and
   laminating the third film sheet piece on a second surface of the panel.

* * * * *